United States Patent
Wu

(10) Patent No.: US 11,456,740 B2
(45) Date of Patent: Sep. 27, 2022

(54) TOUCH DETECTION CIRCUIT WITH DIFFERENT CHARGING AND DISCHARGING CURRENTS AND OPERATING METHOD THEREOF

(71) Applicant: PixArt Imaging Inc., Hsin-Chu County (TW)

(72) Inventor: Sung-Han Wu, Hsin-Chu County (TW)

(73) Assignee: PIXART IMAGING INC., Hsin-Chu County (TW)

( * ) Notice: Subject to any disclaimer, the term of this patent is extended or adjusted under 35 U.S.C. 154(b) by 274 days.

(21) Appl. No.: 16/930,348

(22) Filed: Jul. 16, 2020

(65) Prior Publication Data

US 2022/0021388 A1 Jan. 20, 2022

(51) Int. Cl.
*H03K 17/96* (2006.01)

(52) U.S. Cl.
CPC .............. *H03K 17/9622* (2013.01); *H03K 2217/96074* (2013.01); *H03K 2217/960715* (2013.01)

(58) Field of Classification Search
CPC ... H03K 17/9622; H03K 2217/960715; H03K 2217/96074
USPC ......................................................... 200/600
See application file for complete search history.

(56) References Cited

U.S. PATENT DOCUMENTS

| 10,571,995 B1 * | 2/2020 | Lee ........................ G06F 3/044 |
| 2012/0053873 A1 * | 3/2012 | He ........................ G06F 3/044 702/65 |
| 2015/0002219 A1 * | 1/2015 | Araki ................... H03K 17/962 327/543 |

* cited by examiner

*Primary Examiner* — Tomi Skibinski
(74) *Attorney, Agent, or Firm* — WPAT, PC

(57) ABSTRACT

There is provided a touch detection circuit including a charging circuit, a discharging circuit, a counter and a processor. The charging circuit charges a detection capacitor within a charging interval using different currents. The discharging circuit discharges the detection capacitor within a discharging interval using different currents. The counter counts the charging interval and the discharging interval. The processor subtracts a baseline time from a counted charging time and a counted discharging time to cancel the noise interference.

19 Claims, 5 Drawing Sheets

TOUCH DETECTION CIRCUIT WITH DIFFERENT CHARGING AND DISCHARGING CURRENTS AND OPERATING METHOD THEREOF

BACKGROUND

1. Field of the Disclosure

This disclosure generally relates to a touch detection circuit and, more particularly, to a touch detection circuit with a detection capacitor being charged and discharged using different currents.

2. Description of the Related Art

The capacitive touch circuit detects a touch according to the capacitance variation caused by a conductor approaching thereto. Therefore, a capacitive touch circuit can be used as a capacitive switch, e.g., arranged on a door handle for detecting whether there is touch by a human body.

In the cases that the capacitive switch is used in outdoor environment, because the capacitance variation of the capacitive switch can have a significant change due to the significant fluctuation of environmental parameters including temperature and humidity, the detection correctness is degraded.

Furthermore, when the capacitive switch is used in the environment with high noises, a time interval counting the capacitance variation is possibly affected by noises to cause identification error. For example referring to FIG. 1, it is a schematic diagram of charging and discharging of a conventional capacitive switch. A charging interval Tr is defined as a time interval that a capacitor voltage reaches a reference voltage $V_H$. It is seen from FIG. 1 that when the capacitive switch receives external noises, the time interval that the capacitor voltage reaches $V_H$ is shortened, and thus the identification error is occurred.

Accordingly, it is necessary to provide a touch detection circuit capable of eliminating the environmental change and noise interference.

SUMMARY

The present disclosure provides a touch detection circuit that charges and discharges a detection capacitor using two different currents, and cancels the baseline count during the touch identification to improve the detection accuracy.

The present disclosure further provides a touch detection circuit that avoids the noise frequency by changing charging and discharging currents thereby improving the detection accuracy.

The present disclosure provides a touch detection circuit including a detection capacitor, a charging circuit, a discharging circuit, a counter and a processor. The detection capacitor is configured to generate a capacitor voltage. The charging circuit is configured to charge the detection capacitor within a first charging interval using a first charging current, and charge the detection capacitor within a second charging interval using a second charging current smaller than the first charging current. The discharging circuit is configured to discharge the detection capacitor within a first discharging interval using a first discharging current, and discharge the detection capacitor within a second discharging interval using a second discharging current smaller than the first discharging current. The counter is configured to sequentially count the first charging interval, the second charging interval, the first discharging interval and the second discharging interval as a detection cycle. The processor is configured to identify a touch event according to the second charging interval and the second discharging interval without according to the first charging interval and the first discharging interval.

The present disclosure further provides a touch detection circuit including a detection capacitor, a charging circuit, a discharging circuit, a counter and a processor. The detection capacitor is configured to generate a capacitor voltage. The charging circuit is configured to charge the detection capacitor sequentially using a first charging current and a second charging current, smaller than the first charging current, within a charging interval. The discharging circuit is configured to discharge the detection capacitor sequentially using a first discharging current and a second discharging current, smaller than the first discharging current, within a discharging interval. The counter is configured to sequentially count the charging interval and the discharging interval as a detection cycle. The processor is configured to subtract a charging reference time and a discharging reference time from the detection cycle to generate a time of interest, and output a control signal according to a variation of the time of interest between successive detection cycles.

The present disclosure further provides an operating method of a touch detection circuit. The touch detection circuit includes a detection capacitor, a charging circuit, a discharging circuit and a counter. The operating method includes the steps of: charging, using the charging circuit, the detection capacitor using a first charging current, and counting a first charging interval using the counter; charging, using the charging circuit, the detection capacitor using a second charging current, smaller than the first charging current, and counting a second charging interval using the counter; discharging, using the discharging circuit, the detection capacitor using a first discharging current, and counting a first discharging interval using the counter; discharging, using the discharging circuit, the detection capacitor using a second discharging current, smaller than the first discharging current, and counting a second discharging interval using the counter; and identifying a touch event according to a time variation of multiple summations of the second charging interval and the second discharging interval.

BRIEF DESCRIPTION OF THE DRAWINGS

Other objects, advantages, and novel features of the present disclosure will become more apparent from the following detailed description when taken in conjunction with the accompanying drawings.

DETAILED DESCRIPTION OF THE EMBODIMENT

It should be noted that, wherever possible, the same reference numbers will be used throughout the drawings to refer to the same or like parts.

The touch detection circuit of the present disclosure is applied to, for example, a capacitive switch capable of cancelling the noise interference. The touch detection circuit is especially suitable to an application operated under large fluctuation of environmental parameter and high external noises. By cancelling the baseline voltage, the detection accuracy is improved.

Figure 1:
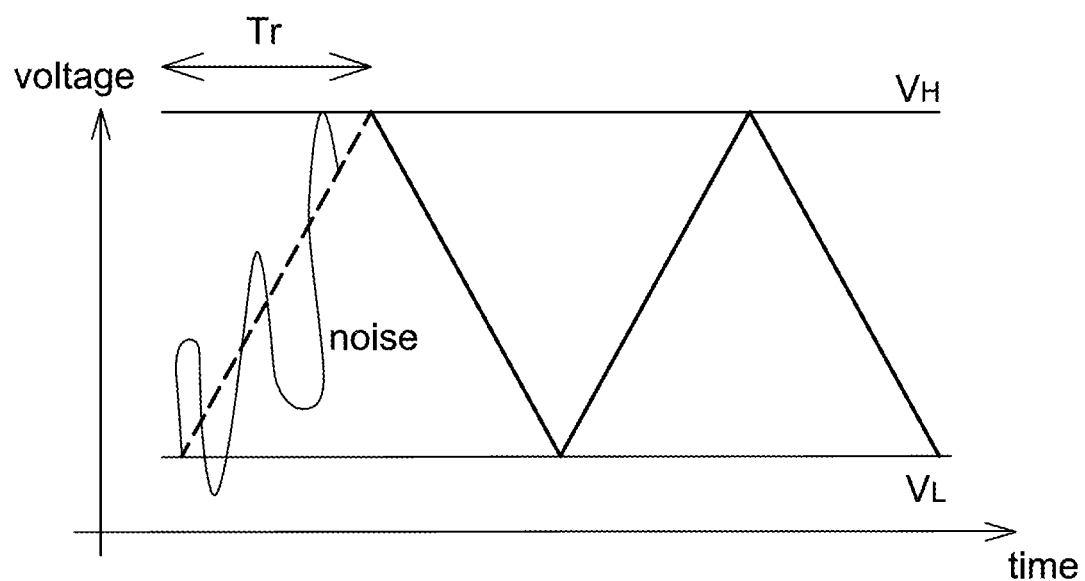
FIG. 1 is a schematic diagram of charging and discharging of a conventional capacitive switch.
Figure 2:
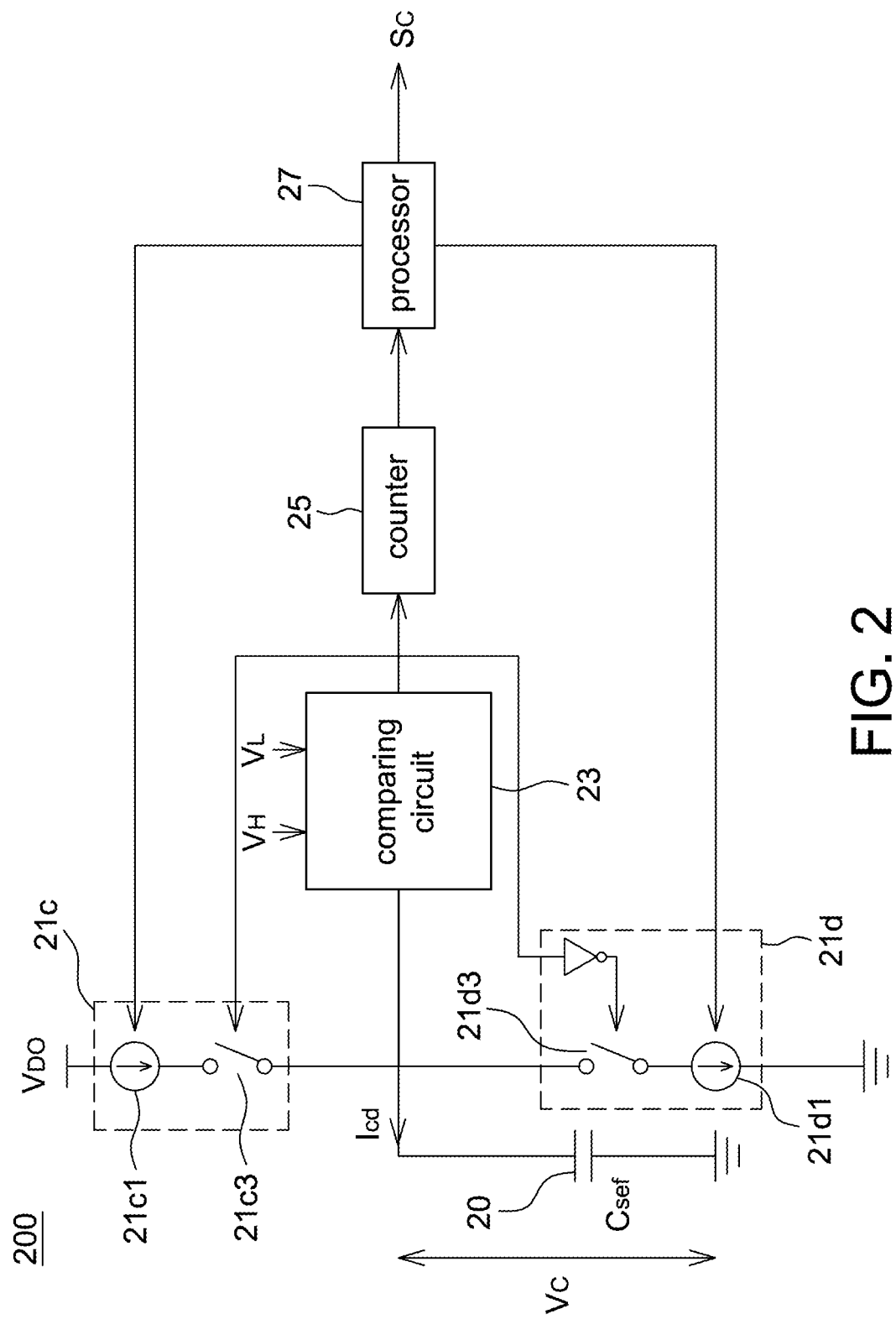
FIG. 2 is a schematic block diagram of a touch detection circuit according to one embodiment of the present disclosure.

Referring to FIG. 2, it is a schematic block diagram of a touch detection circuit 200 according to one embodiment of the present disclosure. The touch detection circuit 200 includes a detection capacitor 20, a charging circuit 21c, a discharging circuit 21d, a comparing circuit 23, a counter 25 and a processor 27, wherein the processor 27 is, for example, a digital signal processor (DSP) or application specific integrated circuit (ASIC) that performs the function thereof using hardware and/or firmware. In one aspect, the charging circuit 21c, the discharging circuit 21d, the comparing circuit 23, the counter 25 and the processor 27 together form a detection chip electrically connected to the detection capacitor 20.

The detection capacitor 20 is generally in a form of electrode, and has capacitance Csef to form a capacitor voltage Vc cross terminals thereof when receiving electricity. The detection capacitor 20 is arranged on a component, such as, but not limited to, a door handle, an appliance switch or a lamp switch, for detecting a conductor (e.g., a hand). When the conductor approaches or touches the detection capacitor 20, the capacitance Csef is changed and such capacitance change is used as the detecting mechanism of a sensitive switch.

As shown in FIG. 2, one end of the detection capacitor 20 is connected to a ground voltage, and the other end thereof is connected to the charging circuit 21c, the discharging circuit 21d and the comparing circuit 23.

The capacitor voltage Vc changes (shown as ΔVc in FIG. 4) with the charging and discharging process. When the capacitance Csef is changed, charging and discharging times are also changed and such time change is used as the mechanism of identifying a touch event.

Figure 3:
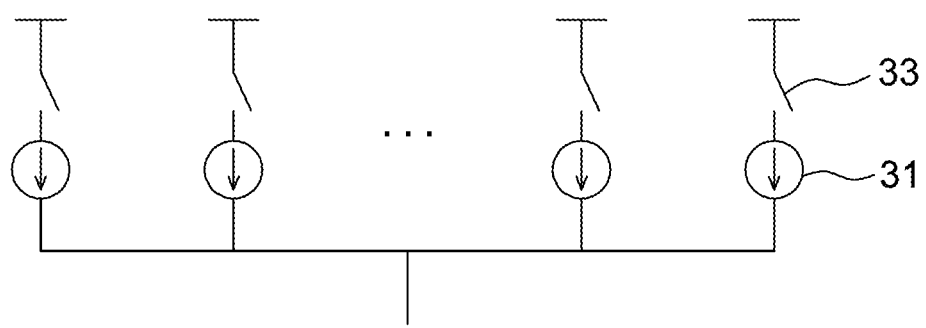
FIG. 3 is a schematic diagram of a current source circuit of a touch detection circuit according to one embodiment of the present disclosure.

The charging circuit 21c includes a variable current source 21c1 and a switching element 21c3 cascaded together, wherein the switching element 21c3 is, for example, a transistor switch. In one non-limiting aspect, the variable current source 21c1 includes multiple current sources 31 and multiple current switches 33 to form a current bank as shown in FIG. 3, wherein the current switches 33 are, for example, transistor switches.

Figure 4:
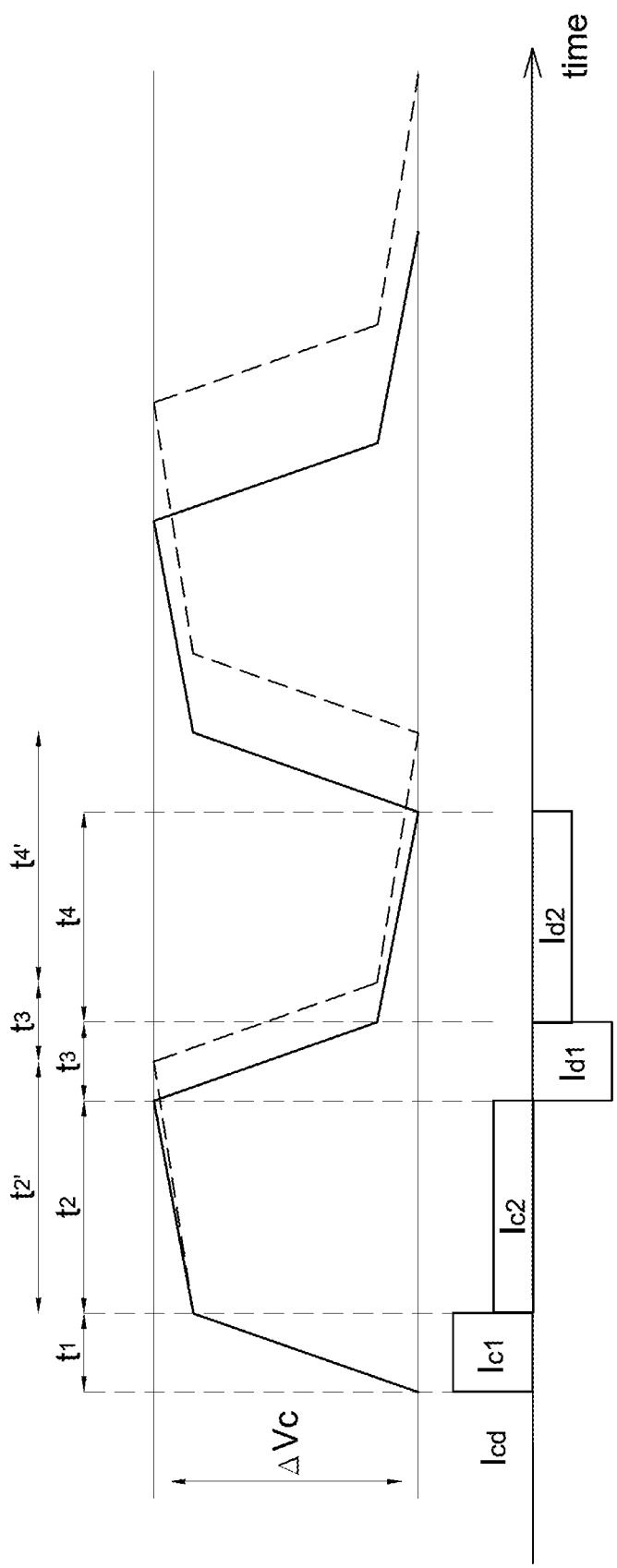
FIG. 4 is a schematic diagram of charging and discharging of a touch detection circuit according to one embodiment of the present disclosure.

Please referring to FIG. 4 together, it is a schematic diagram of charging and discharging of a touch detection circuit 200 according to one embodiment of the present disclosure. The charging circuit 21c is used to charge the detection capacitor 20 within a first charging interval t1 using a first charging current Ic1, and charge the detection capacitor 20 within a second charging interval t2 using a second charging current Ic2 smaller than the first charging current Ic1. For example, the first charging interval t1 and the second charging interval t2 form one complete charging interval. Within the complete charging interval, the charging circuit 21c charges the detection capacitor 20 using the first charging current Ic1 at first, and then charges the detection capacitor 20 using the second charging current Ic2.

In FIGS. 2 and 4, the charging and discharging current is shown as Icd. When the detection capacitor 20 is being charged, Icd is shown to have positive values; whereas, when detection capacitor 20 is being discharged, Icd is shown to have negative values, or vice versa. The positive and negative values herein are only intended to illustrate a current flow direction, but not to limit the present disclosure.

Charging/discharging the detection capacitor 20 using a large current can shorten the charging interval but can have lower sensitive and noise immunity; whereas, charging/discharging the detection capacitor 20 using a small current can have higher sensitivity, but a longer charging interval is required to extend the scanning time. The present disclosure takes features of both, and considers the first charging interval t1 as a charging reference time that has a substantially constant value even when the capacitance Csef is changed by an external conductor. The processor 27 controls the variable current source 21c1 (i.e. controlling the first charging current Ic1 and the second charging current Ic2) and the switching element 21c3 of the charging circuit 21c to cause the second charging interval t2 to be longer than the first charging interval t1. That is, the processor 27 controls the charging reference time (i.e. t1) to be shorter than a half of the charging interval. Preferable, under the circuit limitation, the first charging interval t1 is set as short as possible, and the second charging interval t2 is set as long as possible.

In the aspect shown in FIG. 3, the processor 27 alters the first charging current Ic1 and the second charging current Ic2 by changing conducting or connecting states between the multiple current switches 33 and the multiple current sources 31, e.g., more current switches 33 being conducted, higher charging current being generated.

The discharging circuit 21d includes a variable current source 21d1 and a switching element 21d3 cascaded together, wherein the switching element 21d3 is, for example, a transistor switch. Similarly, in one non-limiting aspect the variable current source 21d1 includes multiple current sources 31 and multiple current switches 33 as shown in FIG. 3.

Please referring to FIG. 4 again, the discharging circuit 21d is used to discharge the detection capacitor 20 within a first discharging interval t3 using a first discharging current Id1, and discharge the detection capacitor 20 within a second discharging interval t4 using a second discharging current Id2 smaller than the first discharging current Id1. For example, the first discharging interval t3 and the second discharging interval t4 form one complete discharging interval. Within the complete discharging interval, the discharging circuit 21d discharges the detection capacitor 20 using the first discharging current Id1 at first, and then discharges the detection capacitor 20 using the second discharging current Id2.

In the present disclosure, the first discharging interval t3 is considered as a discharging reference time that has a substantially constant value even when the capacitance Csef is changed by an external conductor. The processor 27 controls the variable current source 21d1 (i.e. controlling the first discharging current Id1 and the second discharging current Id2) and the switching element 21d3 of the discharging circuit 21d to cause the second discharging interval t4 to be longer than the first discharging interval t3. That is, the processor 27 controls the discharging reference time (i.e. t3) to be shorter than a half of the discharging interval. Preferable, under the circuit limitation, the first discharging interval t3 is set as short as possible, and the second discharging interval t4 is set as long as possible.

In the aspect shown in FIG. 3, the processor 27 alters the first discharging current Id1 and the second discharging current Id2 by changing conducting or connecting states between the multiple current switches 33 and the multiple current sources 31, e.g., more current switches 33 being conducted, higher discharging current being generated.

The comparing circuit 23 compares the capacitor voltage Vc with a first reference voltage $V_H$ and a second reference voltage $V_L$ (e.g., smaller than the first reference voltage $V_H$) to conduct/connect the charging circuit 21c to the detection capacitor 20 or conduct/connect the discharging circuit 21d to the detection capacitor 20. For example, when the charging circuit 21c charges the detection capacitor 20 to cause the capacitor voltage Vc to reach the first reference voltage $V_H$, the output signal of the comparing circuit 23 dis-conducts the switching element 21c3 and conducts the switching element 21d3 to cause the discharging circuit 21d to discharge the detection capacitor 20; whereas, when the capacitor voltage Vc is discharged to reach the second reference voltage $V_L$, the output signal of the comparing circuit 23 dis-conducts the switching element 21d3 and conducts the switching element 21c3 to cause the charging circuit 21c to charge the detection capacitor 20; and the detection capacitor 20 is charged and discharged repeatedly in this way.

In one non-limiting aspect, the comparing circuit 23 includes two comparators respectively taking the first reference voltage $V_H$ and the second reference voltage $V_L$ as an input signal of one of two input terminals, and the other input terminal of the two comparators is coupled to the capacitor voltage Vc. The output of one of the two comparators is used to control ON/OFF of the switching element 21c3, and the output of the other one of the two comparators is used to control ON/OFF of the switching element 21d3.

In another non-limiting aspect, the comparing circuit 23 includes one comparator and one multiplexer. One input terminal of the comparator receives the first reference voltage $V_H$ or the second reference voltage $V_L$ via the multiplexer, and the other input terminal of the comparator is coupled to the capacitor voltage Vc. The output of the comparator is used to control ON/OFF of the switching elements 21c3 and 21d3.

It should be mentioned that a structure of the comparing circuit 23 is not limited to those mentioned herein as long as it is able to compare the capacitor voltage Vc with the first reference voltage $V_H$ and the second reference voltage $V_L$ to accordingly control charging or discharging by controlling ON/OFF of the switching elements 21c3 and 21d3.

In FIG. 2, an inverter in the discharging circuit 21d is used to indicate the switching elements 21c3 and 21d3 are not turned on/off together, but not to limit the present disclosure. For example, the inverter may be arranged in the charging circuit 21c, or the comparing circuit 23 sends out opposite signals to respectively control the switching elements 21c3 and 21d3 without using an inverter in the charging or discharging circuit.

The counter 25 (or called timer) sequentially counts/times lengths of the first charging interval t1, the second charging interval t2, the first discharging interval t3 and the second discharging interval t4, and a summation of t1 to t4 is used as a detection cycle.

In one aspect, the processor 27 identifies a touch event according to the second charging interval t2 and the second discharging interval t4, without according to the first charging interval t1 and the first discharging interval t3. As mentioned above, the charging reference time (i.e. t1) and the discharging reference time (i.e. t3) do not change with approaching of a conductor, and thus they are considered as baseline time that reflects the baseline voltage of the detection capacitor 20. Accordingly, although the counter 25 is counting the whole detection cycle (t1+t2+t3+t4), the processor 27 subtracts the charging reference time t1 and the discharging reference time t3 from the detection cycle (t1+t2+t3+t4) to generate a time of interest (TOI), i.e. a summation of the second charging interval and the second discharging interval (t2+t4).

The processor 27 identifies whether a touch event occurs according to a variation of TOI (t2+t4) between successive detection cycles. For example, when the variation of TIO (t2+t4) is larger than a variation threshold, the processor 27 confirms the occurrence of a touch event and then sends a control signal Sc to open a door or turn on/off an appliance or lamp according to different applications; on the contrary, it means no conductor being approaching.

For example, FIG. 4 shows that when a touch event occurs, the variation of capacitor voltage ΔVc is changed from the solid line to the dashed line to cause the TOI (t2+t4) to be extended to (t2'+t4'). Accordingly, when a value of (t2'+t4')−(t2+t4) exceeds the variation threshold, the processor 27 confirms the occurrence of a touch event.

In addition, the processor 27 may identify whether a touch event occurs according to a comparison result of comparing the variation of detection cycle (t1+t2+t3+t4) and a predetermined threshold, i.e. calculating (t1+t2'+t3+t4')−(t1+t2+t3+t4).

In addition, when the variation of a single TOI or a single detection cycle caused by the change of capacitance Csef is too small, the processor 27 further identifies whether a touch event occurs according to the variation of multiple TOI, i.e. N×(t2+t4) or multiple detection cycles N×(t1+t2+t3+t4).

In one aspect, when identifying that the detection cycle (t1+t2+t3+t4) is equal to or close to a noise cycle (or detection frequency equal to or close to noise frequency), the processor 27 further changes the first charging current Ic1 and the first discharging current Id1 (or also changing the second charging current Ic2 and the second discharging current Id2) to alter the detection cycle such that the noise frequency band is avoided to improve the detection accuracy. For example, the processor 27 is further embedded with a time domain-frequency domain conversion algorithm for calculating the noise frequency. The method of calculating the noise frequency or cycle is known to the art, and thus not described herein.

Figure 5:
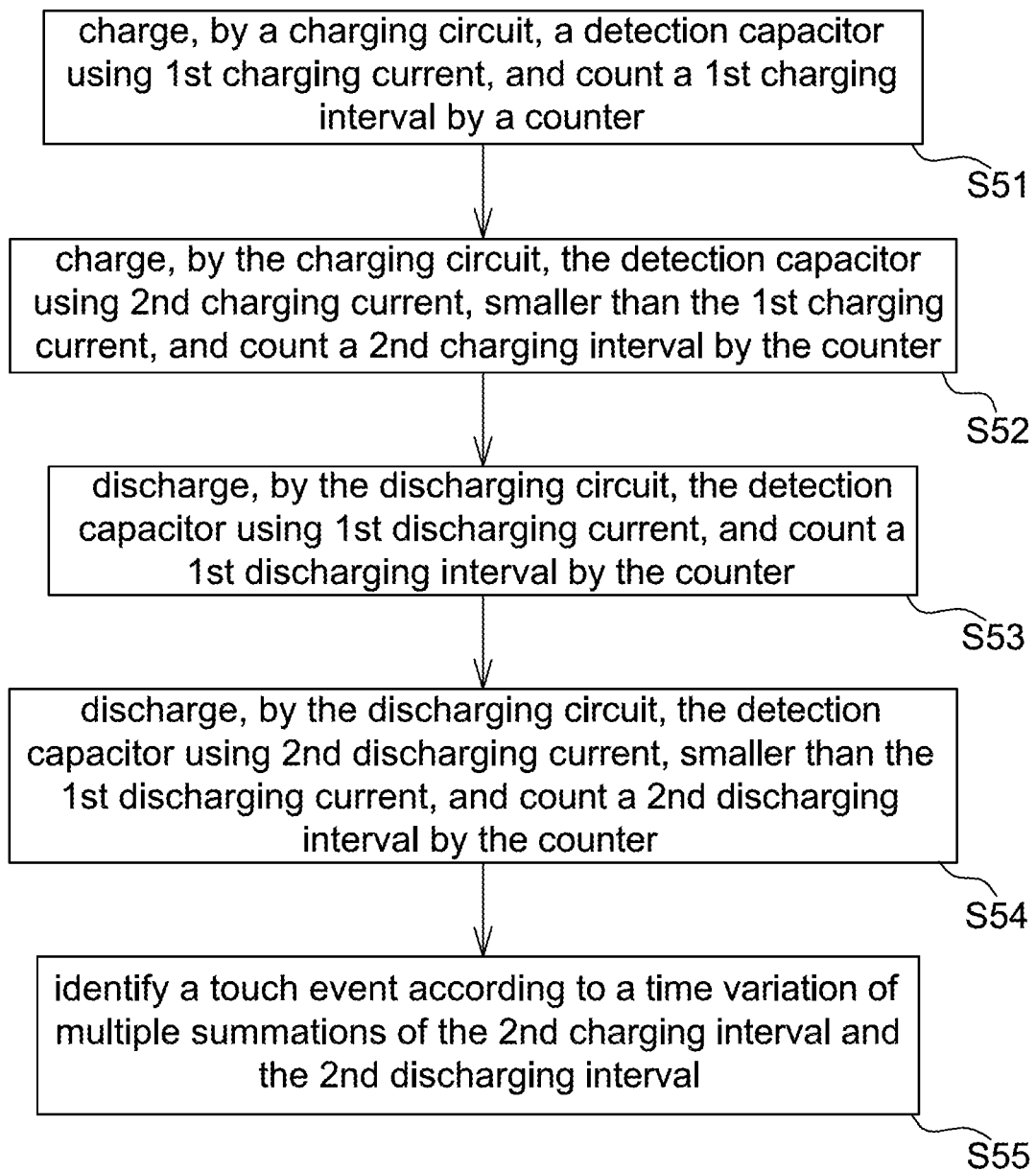
FIG. 5 is a flow chart of an operating method of a touch detection circuit according to one embodiment of the present disclosure.

Referring to FIG. 5, it is a flow chart of an operating method of a touch detection circuit 200 according to one embodiment of the present disclosure, including the steps of: charging, using a charging circuit 21c, a detection capacitor 20 using a first charging current Ic1, and counting a first charging interval t1 using a counter 25 (Step S51); charging, using the charging circuit 21c, the detection capacitor 20 using a second charging current Ic2, smaller than the first charging current Ic1, and counting a second charging interval t2 using the counter 25 (Step S52); discharging, using a discharging circuit 21d, the detection capacitor 20 using a first discharging current Id1, and counting a first discharging interval t3 using the counter 25 (Step S53); discharging, using the discharging circuit 21d, the detection capacitor 20 using a second discharging current Id2, smaller than the first discharging current Id1, and counting a second discharging interval t4 using the counter 25 (Step S54); and identifying a touch event according to a time variation of multiple summations of the second charging interval t2 and the second discharging interval t4. The time variation of multiple summations of the second charging interval t2 and the second discharging interval t4 is N×(t2'+t4')−N×(t2+t4).

As mentioned above, using multiple charging and discharging intervals is to avoid the scenario that the variation of a single charging and discharging interval is smaller than detection sensitivity. In the present disclosure, N is larger than or equal to 1.

Details of this operating method have been illustrated above, and thus are not repeated herein.

As mentioned above, the processor 27 may identify a touch event according to the variation of a summation (t2+t4) of the second charging interval t2 and the second discharging interval t4 between successive detection cycles, and the first charging interval t1 and the first discharging interval t3 are used as the baseline time but not for identifying the touch event.

The operating method of this embodiment further includes the step of: comparing, using a comparing circuit 23, a capacitor voltage Vc of the detection capacitor 20 with a first reference voltage $V_H$ and a second reference voltage $V_L$ to determine whether to charge or discharge the detection capacitor 20.

In some aspects, the comparing circuit 23 further includes a flip-flop to provide a "1" or "0" level for being counted by the counter 25 according to the output of the comparator included in the comparing circuit 23.

It should be mentioned that the value in the above embodiment, e.g., a length of charging and discharging shown in FIG. 4, is only intended to illustrate but not to limit the present disclosure.

It should be mentioned that although the above embodiments are illustrated in a way that two different currents are used to charge the detection capacitor 20 within a charging interval and two different currents are used to discharge the detection capacitor 20 within a discharging interval, the present disclosure is not limited thereto. In other aspects, more than two different currents are used to charge the detection capacitor 20 within the charging interval and more than two different currents are used to discharge the detection capacitor 20 within the discharging interval. The processor 27 identifies a touch event according to charging and discharging intervals corresponding to the minimum charging current and the minimum discharging current.

It should be mentioned that although the above embodiments are illustrated in a way that the touch detection circuit 200 includes a single self-capacitive electrode (e.g., forming the detection capacitor 20), the present disclosure is not limited thereto. In other aspects, the touch detection circuit 200 includes multiple parallel self-capacitive electrodes each being connected to the respective charging circuit, discharging circuit, comparing circuit and counter as shown in FIG. 2. The operation of each self-capacitive electrode is identical to the descriptions mentioned above. The counting results of multiple counters are sent to the same processor 27. When identifying that the counted time variation associated with at least one self-capacitive electrode or with a predetermined number of self-capacitive electrodes exceeds a variation threshold, the occurrence of a touch event is confirmed.

It should be mentioned that although the present disclosure is illustrated using the touch detection circuit, the touch detection circuit is not only used to detect a touch. When a conductor approaches the detection capacitor 20 (to influence the detection capacitor), even though the conductor is not actually in contact with the detection capacitor 20 (or the component arranged with the detection capacitor 20), the touch detection circuit still detects an approaching conductor as long as the variation of charging and discharging interval (i.e. indicating variation of capacitance) exceeds a threshold, wherein a detectable distance is determined according to the threshold being set. That is, a touch event detected by the touch detection circuit 200 of the present disclosure includes the object touch and the object proximity.

As mentioned above, the conventional capacitive switch is easily affected by environmental change and noises to degrade the detection accuracy. Accordingly, the present disclosure further provides a touch detection circuit (e.g., FIG. 2) and an operating method thereof (e.g., FIG. 5) that charge and discharge a detection capacitor using a large current and a small current. The charging and discharging interval associated with the larger current is considered as baseline time and cancelled in identifying the touch event. Furthermore, when a frequency of charging and discharging the detection capacitor is close to the noise frequency, the frequency of charging and discharging is changed by changing the charging and discharging currents to avoid the noise frequency band.

Although the disclosure has been explained in relation to its preferred embodiment, it is not used to limit the disclosure. It is to be understood that many other possible modifications and variations can be made by those skilled in the art without departing from the spirit and scope of the disclosure as hereinafter claimed.

What is claimed is:

1. A touch detection circuit, comprising:
   a detection capacitor, configured to generate a capacitor voltage;
   a charging circuit, configured to charge the detection capacitor within a first charging interval using a first charging current, and charge the detection capacitor within a second charging interval using a second charging current smaller than the first charging current;
   a discharging circuit, configured to discharge the detection capacitor within a first discharging interval using a first discharging current, and discharge the detection capacitor within a second discharging interval using a second discharging current smaller than the first discharging current;
   a counter, configured to sequentially count the first charging interval, the second charging interval, the first discharging interval and the second discharging interval as a detection cycle; and
   a processor, configured to identify a touch event according to the second charging interval and the second discharging interval without according to the first charging interval and the first discharging interval.

2. The touch detection circuit as claimed in claim 1, further comprising a comparing circuit, wherein the comparing circuit is configured to compare the capacitor voltage with a first reference voltage and a second reference voltage for conducting the charging circuit to the detection capacitor or conducting the discharging circuit to the detection capacitor.

3. The touch detection circuit as claimed in claim 2, wherein the charging circuit and the discharging circuit respectively comprise a variable current source and a switching element, and the processor is further configured to
   control the variable current source and the switching element of the charging circuit to cause the second charging interval to be larger than the first charging interval, and control the variable current source and the switching element of the discharging circuit to cause the second discharging interval to be larger than the first discharging interval.

4. The touch detection circuit as claimed in claim 3, wherein within the detection cycle,
the first charging interval is prior to the second charging interval, and
the first discharging interval is prior to the second discharging interval.

5. The touch detection circuit as claimed in claim 1, wherein the processor is further configured to change the first charging current and the first discharging current to alter the detection cycle when the detection cycle is equal to a noise cycle.

6. The touch detection circuit as claimed in claim 5, wherein
the charging circuit and the discharging circuit respectively comprise multiple current sources and multiple current switches, and
the processor is configured to change the first charging current and the first discharging current by changing conducting states between the multiple current sources and multiple current switches.

7. The touch detection circuit as claimed in claim 1, wherein when a variation of a summation of the second charging interval and the second discharging interval between successive detection cycles is larger than a variation threshold, the processor identifies occurrence of the touch event.

8. A capacitive switch, comprising:
a detection capacitor, configured to generate a capacitor voltage;
a charging circuit, configured to charge the detection capacitor sequentially using a first charging current and a second charging current, smaller than the first charging current, within a charging interval;
a discharging circuit, configured to discharge the detection capacitor sequentially using a first discharging current and a second discharging current, smaller than the first discharging current, within a discharging interval;
a counter, configured to sequentially count the charging interval and the discharging interval as a detection cycle; and
a processor, configured to subtract a charging reference time and a discharging reference time from the detection cycle to generate a time of interest, and output a control signal according to a variation of the time of interest between successive detection cycles.

9. The capacitive switch as claimed in claim 8, wherein the processor is configured to
control the charging circuit to charge the detection capacitor within the charging reference time using the first charging current, and
control the discharging circuit to discharge the detection capacitor within the discharging reference time using the first discharging current.

10. The capacitive switch as claimed in claim 9, further comprising a comparing circuit, wherein the comparing circuit is configured to compare the capacitor voltage with a first reference voltage and a second reference voltage for conducting the charging circuit to the detection capacitor or conducting the discharging circuit to the detection capacitor.

11. The capacitive switch as claimed in claim 10, wherein the charging circuit and the discharging circuit respectively comprise a switching element, and the processor is further configured to
control the switching element of the charging circuit to cause the charging reference time to be smaller than a half of the charging interval, and
control the switching element of the discharging circuit to cause the discharging reference time to be smaller than a half of the discharging interval.

12. The capacitive switch as claimed in claim 8, wherein the processor is further configured to change the first charging current and the first discharging current to alter the detection cycle when the detection cycle is equal to a noise cycle.

13. The capacitive switch as claimed in claim 12, wherein
the charging circuit and the discharging circuit respectively comprise multiple current sources and multiple current switches, and
the processor is configured to change the first charging current and the first discharging current by changing conducting states between the multiple current sources and multiple current switches.

14. An operating method of a touch detection circuit, the touch detection circuit comprising a detection capacitor, a charging circuit, a discharging circuit and a counter, the operating method comprising:
charging, using the charging circuit, the detection capacitor using a first charging current, and counting a first charging interval using the counter;
charging, using the charging circuit, the detection capacitor using a second charging current, smaller than the first charging current, and counting a second charging interval using the counter;
discharging, using the discharging circuit, the detection capacitor using a first discharging current, and counting a first discharging interval using the counter;
discharging, using the discharging circuit, the detection capacitor using a second discharging current, smaller than the first discharging current, and counting a second discharging interval using the counter; and
identifying a touch event according to a time variation of multiple summations of the second charging interval and the second discharging interval.

15. The operating method as claimed in claim 14, wherein the first charging interval and the first discharging interval are not configured to identify the touch event.

16. The operating method as claimed in claim 14, wherein the touch detection circuit further comprises a comparing circuit, and the operating method further comprises:
comparing, using the comparing circuit, a capacitor voltage of the detection capacitor with a first reference voltage and a second reference voltage to determine whether to charge or discharge the detection capacitor.

17. The operating method as claimed in claim 14, wherein the charging circuit and the discharging circuit respectively comprise a variable current source and a switching element, and the operating method further comprises:
controlling the variable current source and the switching element of the charging circuit to cause the second charging interval to be larger than the first charging interval; and
controlling the variable current source and the switching element of the discharging circuit to cause the second discharging interval to be larger than the first discharging interval.

18. The operating method as claimed in claim 14, wherein the first charging interval, the second charging interval, the first discharging interval and the second discharging interval form a detection cycle, and the operating method further comprises:

changing the first charging current and the first discharging current to alter the detection cycle when the detection cycle is equal to a noise cycle.

19. The operating method as claimed in claim 18, wherein the charging circuit and the discharging circuit respectively comprise multiple current sources and multiple current switches, and the operating method further comprises:

changing conducting states between the multiple current sources and the multiple current switches to alter the first charging current and the first discharging current.

\* \* \* \* \*